United States Patent
Takahashi

[19]

[11] Patent Number: 6,037,824
[45] Date of Patent: Mar. 14, 2000

[54] SIGNAL INPUT CIRCUIT

[75] Inventor: Yasuhiko Takahashi, Tokyo, Japan

[73] Assignee: Nippon Steel Corporation, Tokyo, Japan

[21] Appl. No.: 08/948,941

[22] Filed: Oct. 10, 1997

[30] Foreign Application Priority Data

Oct. 13, 1996 [JP] Japan ................................. 8-289131

[51] Int. Cl.[7] ...................................................... G06G 7/64
[52] U.S. Cl. ........................... 327/337; 327/94; 327/100; 327/132
[58] Field of Search ................................. 327/100, 131, 327/132, 336, 337, 379, 551, 554, 91, 94, 96

[56] References Cited

U.S. PATENT DOCUMENTS

| | | | |
|---|---|---|---|
| 3,602,826 | 8/1971 | List et al. | 327/69 |
| 3,864,583 | 2/1975 | Fiorino | 327/100 |
| 4,918,338 | 4/1990 | Wong | 327/345 |
| 5,070,516 | 12/1991 | Le Comte | 327/50 |
| 5,325,065 | 6/1994 | Bennett et al. | 327/100 |
| 5,528,187 | 6/1996 | Sato et al. | 327/141 |

FOREIGN PATENT DOCUMENTS 8-63268  3/1996  Japan .

*Primary Examiner*—Kenneth B. Wells
*Attorney, Agent, or Firm*—Pollock, Vande Sande & Amernick

[57] ABSTRACT

In a signal input circuit, an input signal integrating circuit integrates an input signal in only a predetermined integration period. A reference voltage integrating circuit integrates a reference voltage in only the predetermined integration period. A differential amplifier circuit amplifies a difference between an output signal of the input signal integrating circuit and an output signal of the reference voltage integrating circuit. The input signal integrating circuit may be a charge/discharge type integrating circuit which stores charges corresponding to the input signal in only the predetermined integration period and thereafter releases the stored charges before the next integration period. The reference voltage integrating circuit may be a charge/discharge type integrating circuit which stores charges corresponding to the reference voltage in only the predetermined integration period and thereafter releases the stored charges before the next integration period. The differential amplifier circuit may be a current mirror type differential amplifier or a cross-coupled sense amplifier.

10 Claims, 8 Drawing Sheets

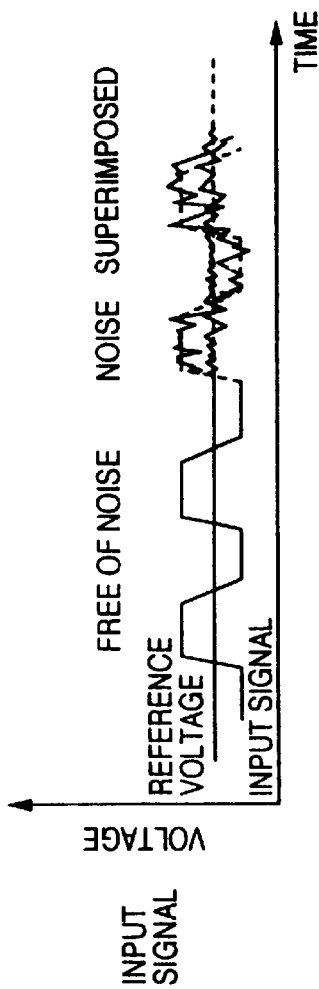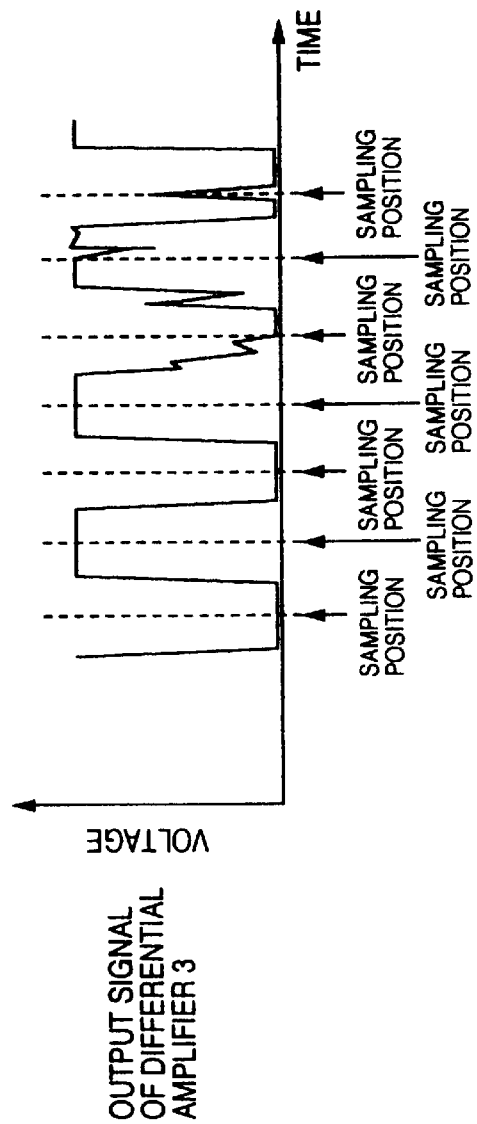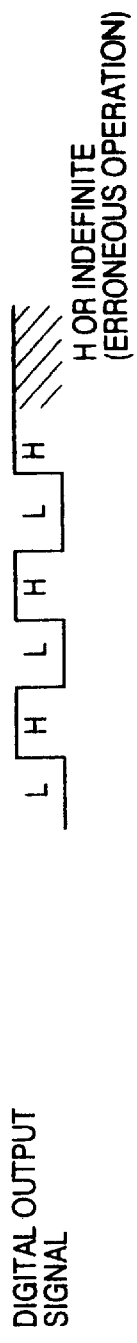
FIG.2A PRIOR ART
FIG.2B PRIOR ART
FIG.2C PRIOR ART

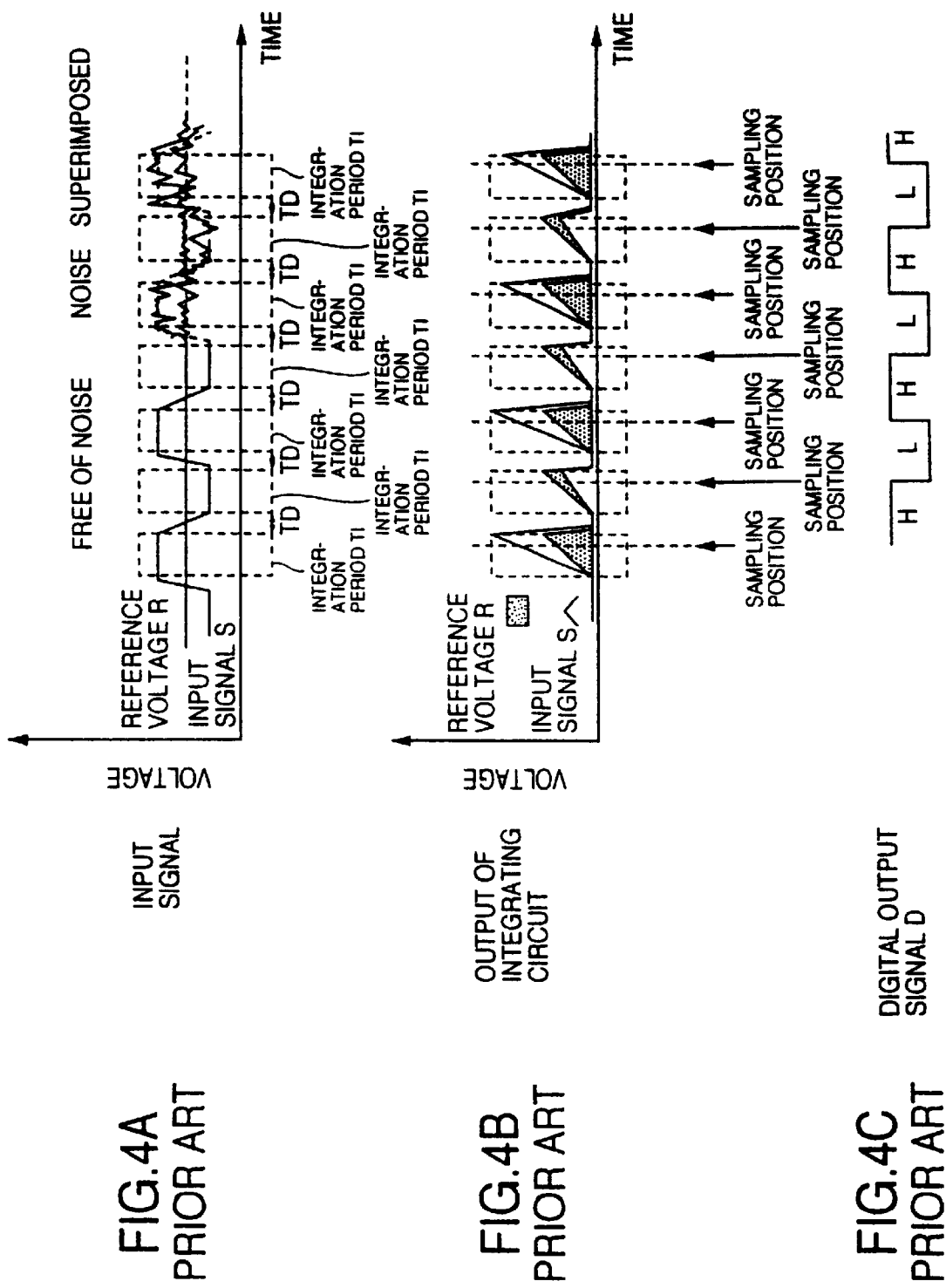

SIGNAL INPUT CIRCUIT

BACKGROUND OF THE INVENTION

1. Field of the Invention

The present invention relates to a signal input circuit, and more particularly to a digital signal input circuit suitable for use in a high-speed and small-amplitude interface circuit.

2. Description of the Related Art

Hitherto, a circuit including the combination of a current mirror type differential amplifier and a latch circuit has been used widely as a circuit for inputting a digital signal having a small amplitude. In such a circuit, the small-amplitude digital signal is amplified by the current mirror type differential amplifier up to a voltage capable of being handled by a digital circuit and is thereafter held by the latch circuit. For example, a signal input circuit shown in FIG. 1 includes a differential amplifier 3 for amplifying a difference between an input signal (or a small-amplitude digital signal) and a reference voltage and a latch circuit 4 for taking an output signal of the differential amplifier 3 therein by a clock signal and holding it. The input signal is amplified by the differential amplifier 3 and is thereafter stored in the latch circuit 4 under control of the clock signal and held thereby. Thereafter, the input signal is outputted as a digital output signal from the latch circuit 4.

In such an input circuit, however, since the output signal of the differential amplifier 3 is stored in the latch circuit 4 under control of the clock signal, the latch circuit 4 takes in only a momentary voltage of the input signal which is continuously valid for a certain time. Accordingly, such an input circuit is to erroneously determining the level of the input signal in the case where noise is superimposed on the input signal.

For example, as shown in FIGS. 2A to 2C, in the case where noise is not superimposed on the input signal, the output signal of the differential amplifier 3 assumes a rectangular wave corresponding to a difference between the input signal and the reference voltage, and the digital output signal outputted from the latch circuit 4 also assumes a rectangular wave corresponding to the input signal. However, in the case where noise is superimposed on the input signal, it does not necessarily follow due to the influence of the noise that the output signal of the differential amplifier 3 assumes a rectangular wave corresponding to a difference between the input signal and the reference voltage. Namely, when a large amplitude noise signal is superimposed on the input signal at a point of time traced back from the timing of latching by the latch circuit 4 by a delay time of the differential amplifier 3, the output signal of the differential amplifier 3 is not accurate, and an insufficient voltage is produced at the time of latching by the latch circuit 4. In such a case, an abnormal condition called a "metastable" condition is generated in the latch circuit 4 so that an erroneous voltage is held by the latch circuit 4.

In order to have the maximum margin for noise, the waveform of the input signal must be approximated to a rectangular wave as much as possible, and it is necessary that the time of latching by the latch circuit 4 be set to a point of time when the amplitude of the input signal becomes a maximum. However, in the case where the transfer rate becomes higher than 100 MHz, it is very difficult to pricisely control the waveform the input signal and the timing of latching by the latch circuit 4.

Also, JP-A-8-63268 has disclosed an input/output interface circuit device in which an integrating circuit for integrating an input signal is provided to reduce the influence of noise. However, this input/output interface circuit device does not have an integrating circuit for integrating a reference voltage inputted from a reference voltage terminal. Therefore, in the case where noise is superimposed on the reference voltage, it is not possible to obtain an accurate digital output signal.

SUMMARY OF THE INVENTION

An object of the present invention is to provide a signal input circuit in which an accurate digital output signal can be obtained even if noise is superimposed on an input signal and a reference voltage.

To attain the above object, a signal input circuit of the present invention, includes a digital signal input circuit for comparing an input signal and a reference voltage to determine "0" or "1", is provided with an input signal integrating circuit for integrating an input an analog signal in a period determined in accordance with an extended timing signal, a reference voltage integrating circuit for integrating a reference voltage as an analog voltage in only that period, and a comparing circuit for comparing an output signal of the input signal integrating circuit, and an output signal of the reference voltage integrating circuit.

Prior to the comparison of the input signal and the reference voltage, the input signal and the reference voltage are integrated in only the predetermined period by the input signal integrating circuit and the reference voltage integrating circuit, respectively. This integration period is determined from the signal transfer rate of the input signal. In the case where the input signal is an NRZ signal, it is preferable that the integration period is substantially the same as or slightly shorter than the reciprocal of the transfer rate of the input signal (that is, the period of the input signal). When the input signal or the reference voltage is integrated as an analog signal, noise randomly superimposed on the input signal is averaged and cancelled. Also, the comparison of the input signal and the reference voltage is not made in real time. Therefore, even in the case where the logic is momentarily inverted due to instantaneous noise, the inversion does not affect the operation if a time of inversion is sufficiently short. In the case of random noise, the integration is very practical since it is considered that noise with a large voltage is unlikely, and the time of duration is short. Further, since a sampling at a specified point of time is not made, the waveform distortion of the input signal provides little impact on judging logic state.

The sequence of the integration and comparison is important. In general, the speed of a differential amplifier is not high enough to completely amplify high frequencies included in noise. This means that for noise with a small amplitude, the differential amplifier functions as a low-pass filter to eliminate the noise. However, in the case where the noise is large enough to invert an output signal of the differential amplifier, there is a possibility that an erroneous output signal continues to be outputted for some time after the elimination of the noise. In the case where such a signal is integrated, the influence of noise with a large amplitude increases to the contrary.

On the other hand, with the direct integration of the input signal as in the present invention, the speed of the integrating circuit is high enough to integrate the input signal. Also, the separate integrating circuits are prepared for the input signal and for the reference voltage, respectively. Accordingly, there is no fear that noise superimposed on the input signal unexpectedly influences the circuit.

The integrating circuit can be a charge/discharge type integrating circuit which operates at a timing determined by an external timing signal the comparing circuit can be a current mirror type differential amplifier or a cross-coupled differential amplifier. Also, it is preferable that a reset/set (RS) flip-flop circuit for storing an output signal of the comparing circuit be provided.

For higher-speed signal transfer, a signal input system capable of continuously performing an input operation can be constructed by using a plurality of the above-mentioned signal input circuits, and driving the plurality of signal input circuits in accordance with a plurality of continuous internal timing signals which are generated from the external timing signal and which do not overlap each other.

A signal input circuit according to a first aspect of the present invention comprises input signal analog integrating means for integrating an input signal in only a predetermined integration period, analog reference voltage integrating means for integrating a reference voltage in only the predetermined integration period, and differential amplifier means for amplifying a difference between an output signal of the input signal analog integrating means and an output signal of the analog reference voltage integrating means.

A signal input circuit according to a second aspect of the present invention comprises first and second signal input circuit units, in which the first signal input circuit unit includes first input signal analog integrating means for integrating an input signal in only a predetermined integration period at a timing defined by a first clock signal analog, first reference voltage integrating means for integrating a reference voltage in only the predetermined integration period at the timing defined by the first clock signal, and first differential amplifier means for amplifying a difference between an output signal of the first input signal integrating means and an output signal of the first reference voltage integrating means. The second signal input circuit unit includes a second input signal analog integrating means for integrating the input signal in only the predetermined integration period at a timing defined by a second clock signal, second reference voltage analog integrating means for integrating the reference voltage in only the predetermined integration period at the timing defined by the second clock signal, and second differential amplifier means for amplifying a difference between an output signal of the second input signal integrating means and an output signal of the second reference voltage integrating means.

A signal input circuit according to a third aspect of the present invention comprises an integrating circuit section, a change-over section and a differential-amplifier/latch section. The integrating circuit section includes a charging portion provided with a first charging transistor which has a gate inputted with an input signal and a drain connected to a first integrating node, and a second charging transistor which has a gate inputted with a reference voltage and a drain connected to a second integrating node. A first discharging portion sets a voltage of the first integrating node and a voltage of the second integrating node to a predetermined voltage inclusive of 0 V in accordance with a first clock signal. The change-over section includes a first separating transistor having a source/drain connected to the first integrating node, and a drain/source connected to a first node, the first separating transistor being turned on in accordance with the first clock signal. A second separating transistor has a source/drain connected to the second integrating node and a drain/source connected to a second node, the second separating transistor being turned on simultaneously with the first separating transistor in accordance with the first clock signal. A third separating transistor has a source/drain connected to the first node and a drain/source connected to a third node, the third separating transistor being turned on when the first separating transistor is turned off in accordance with the first clock signal. A fourth separating transistor has a source/drain connected to the second node and a drain/source connected to a fourth node, the fourth separating transistor being turned on simultaneously with the third separating transistor in accordance with the first clock signal. The differential-amplifier/latch section includes a sense amplifier portion provided with a first inverter circuit which has an input terminal connected to the second node and an output terminal connected to the third node and a second inverter circuit which has an input terminal connected to the first node and an output terminal connected to the fourth node, the sense amplifier portion amplifying a difference between the voltage of the first node and the voltage of the second node in accordance with a logical product of the first clock signal and a second clock signal different in phase from the first clock signal. A second discharging portion for setting each of a voltage of the third node and a voltage of the fourth node to a predetermined voltage inclusive of 0 V in accordance with a third clock signal, and a latch portion provided with a reset/set flip-flop circuit inputted with the voltage of the third node and the voltage of the fourth node.

BRIEF DESCRIPTION OF THE DRAWINGS

FIGS. 2A to 2C are waveform diagrams for explaining the operation of the signal input circuit shown in FIG. 1;

FIGS. 4A to 4C are waveform diagrams for explaining the operation of the signal input circuit shown in FIG. 3;

DESCRIPTION OF THE PREFERRED EMBODIMENTS (First Embodiment)

Figure 1:
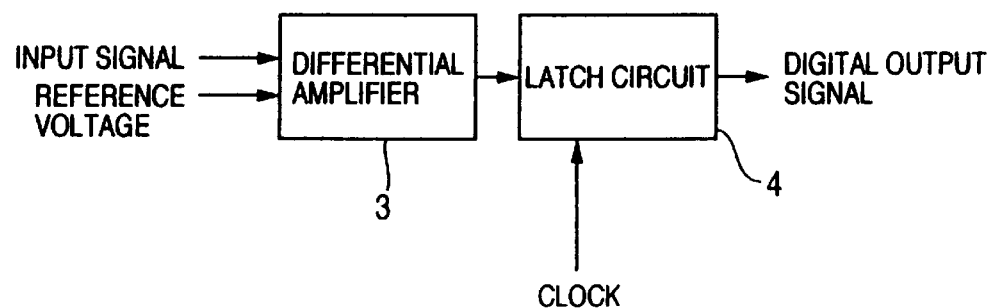
FIG. 1 is a block diagram showing the conventional input signal circuit.
Figure 3:
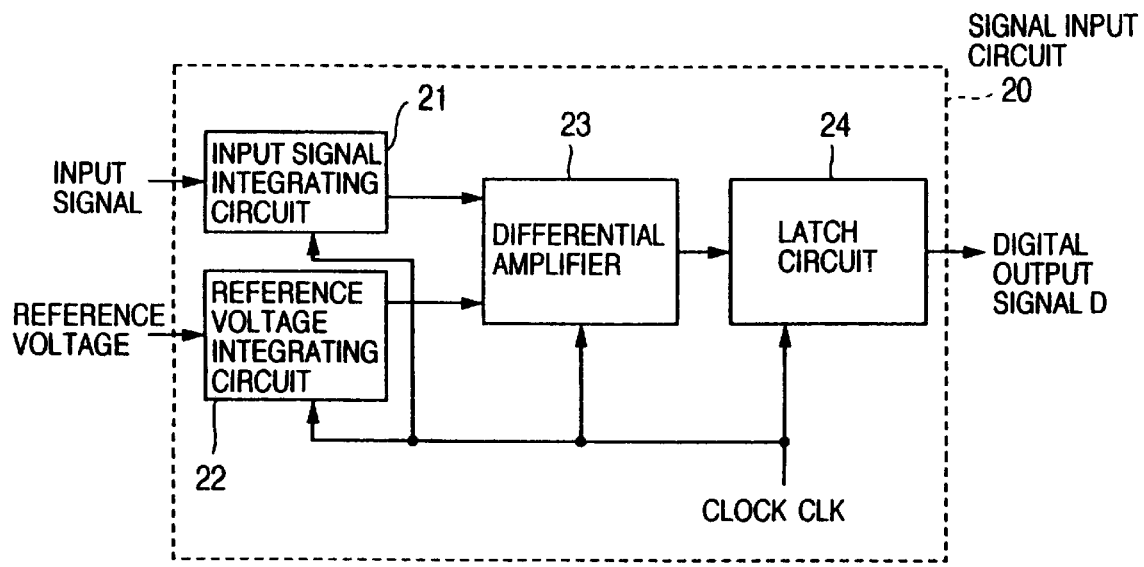
FIG. 3 is a block diagram showing a signal input circuit according to a first embodiment of the present invention.

FIG. 3 shows a signal input circuit 20 according to a first embodiment of the present invention. The signal input circuit 20 includes an input signal integrating circuit 21 receiving an input signal S and a clock signal CLK, a reference voltage integrating circuit 22 inputted with a reference voltage R and the clock signal CLK, a differential amplifier 23 for amplifying a difference between an output signal of the input signal integrating circuit 21 and an output signal of the reference voltage integrating circuit 22, and a latch circuit 24 for receiving an output signal of the differential amplifier 23 in response to the clock signal CLK and holding it. A digital output signal D is outputted from the latch circuit 24.

The input signal integrating circuit 21 is a charge/discharge type integrating circuit which stores charges corresponding to the input signal S in only an integration period defined by the clock signal CLK and thereafter releases the stored charges in a discharge period until the next integration period. The reference voltage integrating circuit 22 is a charge/discharge type integrating circuit which stores charges corresponding to the reference voltage R in only an integration period defined by the clock signal CLK and thereafter releases the stored charges in a discharge period until the next integration period.

In the case where noise is not superimposed on the input signal S and the reference voltage R, the input signal S assumes a rectangular waveform signal and the reference voltage R assumes a voltage having an intermediate DC voltage level between the minimum and maximum voltage levels of the input signal S, as shown in the left half of FIG. 4A. The rectangular waveform input signal S is integrated by the input signal analog integrating circuit 21 in only an integration period TI shown in FIG. 4A so that an output signal of the input signal integrating circuit 21 has a gradual increase in the integration period TI and the subsequent gradual decrease in a discharge period TD, as shown in FIG. 4B. Also, the reference voltage R is integrated by the reference voltage analog integrating circuit 22 in only the integration period TI so that an output signal of the reference voltage integrating circuit 22 has a gradual increase in the integration period TI and the subsequent gradual decrease in the discharge period TD, as shown in FIG. 4B. At this time, in the case where the level of the input signal S is larger than the level of the reference voltage R, there is no possibility that the maximum value of the output signal of the reference voltage integrating circuit 22 becomes larger than the maximum value of the output signal of the input signal integrating circuit 21. On the other hand, in the case where the level of the input signal S is smaller than the level of the reference voltage R, there is no possibility that the maximum value of the output signal of the reference voltage integrating circuit 22 becomes smaller than the maximum value of the output signal of the input signal integrating circuit 21. Accordingly, when an output signal of the differential amplifier 23 corresponding to a difference between the output signal of the input signal integrating circuit 21 and the output signal of the reference voltage integrating circuit 22 is received in the latch circuit 24 at a sampling position slightly before the end of the integration period TI (see FIG. 4C) and is held, so that a digital output signal D from the latch circuit 24 exhibits a signal corresponding to the input signal S, as shown in FIG. 4C. Namely, when the level of the input signal S is larger than the level of the reference voltage R, the digital output signal D takes a high level (H). On the other hand, when the level of the input signal S is smaller than the level of the reference voltage R, the digital output signal D takes a low level (L).

In contrast with this, in the case where noise is superimposed on the input signal S and the reference voltage R, the input signal S assumes not a rectangular waveform signal but a signal the level of which has a complicated change in the integration period TI, as shown in the right half of FIG. 4A. Also, the reference voltage R assumes not a voltage having a predetermined DC voltage level but a voltage the DC voltage level of which has a complicated change. However, the input signal S is integrated by the input signal analog integrating circuit 21 in only the integration period TI. Thereby, the output signal of the input signal integrating circuit 21 exhibits a signal as shown in FIG. 4B or a signal which is substantially similar to that in the case where noise is not superimposed on the input signal S. The output signal of the reference voltage integrating circuit 22 also exhibits a signal as shown in FIG. 4B or a signal which is substantially similar to that in the case where noise is not superimposed on the reference voltage R. At this time, in the case where the level of the input signal S exclusive of noise is larger than that of the reference voltage R exclusive of noise, there is no possibility that the maximum value of the output signal of the reference voltage integrating circuit 22 becomes larger than the maximum value of the output signal of the input signal integrating circuit 21. On the other hand, in the case where the level of the input signal S exclusive of noise is smaller than that of the reference voltage R exclusive of noise, there is no possibility that the maximum value of the output signal of the reference voltage integrating circuit 22 becomes smaller than the maximum value of the output signal of the input signal integrating circuit 21. Accordingly, when an output signal of the differential amplifier 23 corresponding to a difference between the output signal of the input signal integrating circuit 21 and the output signal of the reference voltage integrating circuit 22 is taken in the latch circuit 24 at a sampling position slightly before than the end of the integration period TI (see FIG. 4C) and is held, so that a digital output signal D outputted from the latch circuit 24 exhibits a signal corresponding to the input signal S exclusive of noise, as shown in FIG. 4C. Namely, when the level of the input signal S exclusive of noise is larger than that of the reference voltage R exclusive of noise, the digital output signal D takes a high level (H) and when the level of the input signal S exclusive of noise is smaller than that of the reference voltage R exclusive of noise, the digital output signal D takes a low level (L).

(Second Embodiment)

Figure 5:
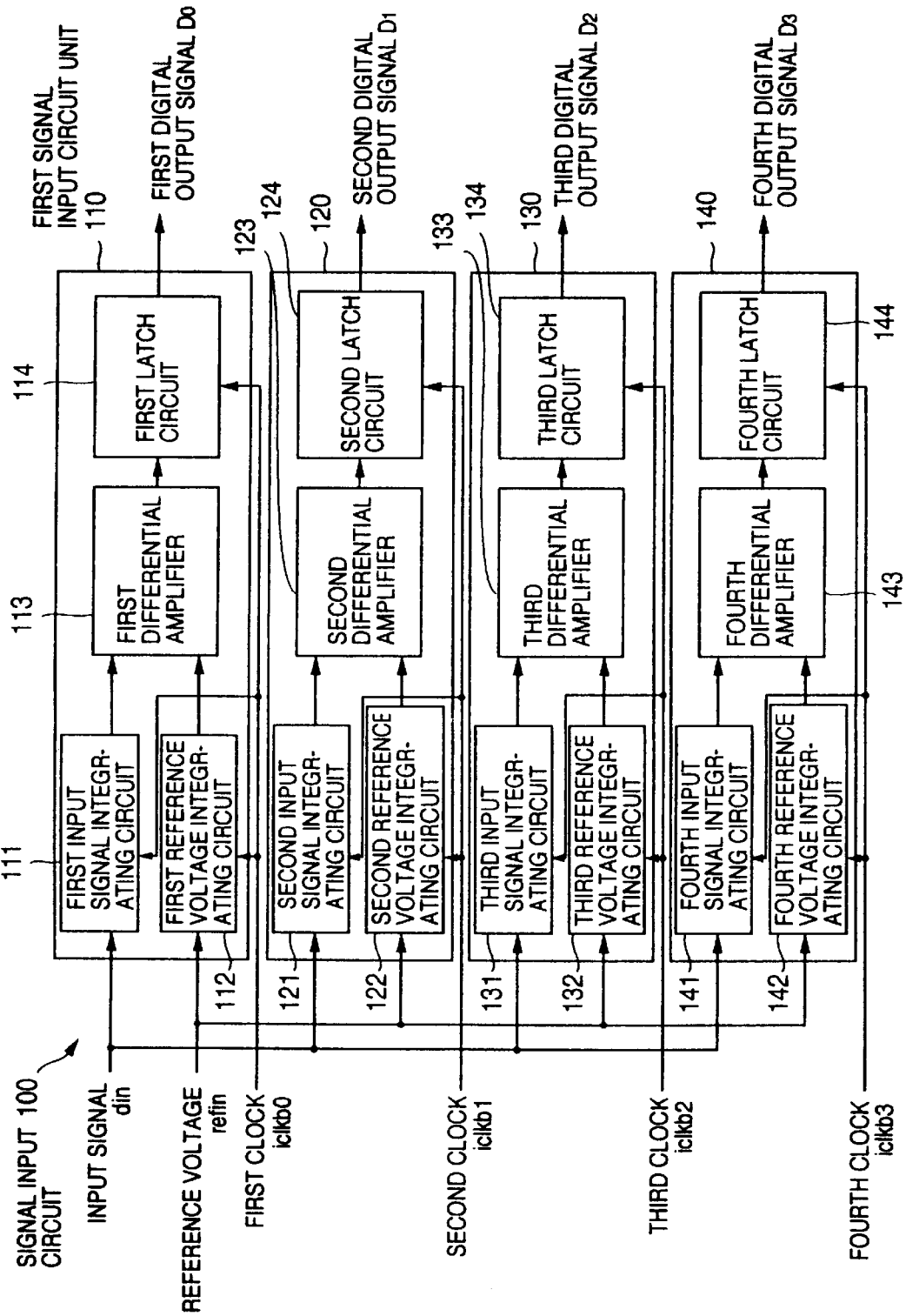
FIG. 5 is a block diagram showing a signal input circuit according to a second embodiment of the present invention.

An input signal din handled in an actual LSI for memory has a bit rate of 800 Mbit/s and an amplitude of ±0.2 V for a reference voltage refin of 0.2 V. Since such an input signal din is too fast for the use in the device, it is necessary to reduce the bit rate down to about 200 Mbit/s. A signal input circuit 100 according to a second embodiment of the present invention is used in such a case. As shown in FIG. 5, the signal input circuit 100 is provided with first to fourth signal input circuit units 110 to 140 each having a construction similar to that of the signal input circuit 20 shown in FIG. 3 and the first to fourth signal input circuit units 110 to 140 are driven by a four-phase clock signal (or first to fourth clocks iclkb0 to iclkb3) having a frequency of 800 MHz.

The first signal input circuit unit 110 includes a first input signal integrating circuit 111 inputted with the input signal din and the first clock signal iclkb0, a first reference voltage integrating circuit 112 inputted with the reference voltage refin and the first clock signal iclkb0, a first differential amplifier 113 of a current mirror type for amplifying a difference between an output signal of the first input signal integrating circuit 111 and an output signal of the first reference voltage integrating circuit 112, and a first latch circuit 114 for receiving and holding an output signal of the first differential amplifier 113 in respect to the first clock signal iclkb0. A first digital output signal D0 is outputted from the first latch circuit 114. Strictly speaking, the timing of input of the first clock signal iclkb0 to the first input signal integrating circuit 111 and the first reference voltage integrating circuit 112 is not completely coincident with that of input of the first clock signal iclkb0 to the first latch circuit 114 provided in the rear stage of the integrating circuits because the latter includes a slight delay. However, since the amount of delay is very small, the delay at this portion will be neglected in the present specification.

The second signal input circuit unit 120 includes a second input signal integrating circuit 121 inputted with the input signal din and the second clock signal iclkb1, a second reference voltage integrating circuit 122 inputted with the reference voltage refin and the second clock signal iclkb1, a second differential amplifier 123 a current mirror type for amplifying a difference between an output signal of the second input signal integrating circuit 121 and an output signal of the second reference voltage integrating circuit 122, and a second latch circuit 124 for receiving and holding an output signal of the second differential amplifier 123 in respect to the second clock signal iclkb1. A second digital output signal D1 is outputted from the second latch circuit 124.

The third signal input circuit unit 130 includes a third input signal integrating circuit 131 inputted with the input signal din and the third clock signal iclkb2, a third reference voltage integrating circuit 132 inputted with the reference voltage refin and the third clock signal iclkb2, a third differential amplifier 133 of current mirror type for amplifying a difference between an output signal of the third input signal integrating circuit 131 and an output signal of the third reference voltage integrating circuit 132, and a third latch circuit 134 for receiving and holding an output signal of the third differential amplifier 133 in respect to the third clock signal iclkb2. A third digital output signal D2 is outputted from the third latch circuit 134.

The fourth signal input circuit unit 140 includes a fourth input signal integrating circuit 141 inputted with the input signal din and the fourth clock signal iclkb3, a fourth reference voltage integrating circuit 142 inputted with the reference voltage refin and the fourth clock signal iclkb3, a fourth differential amplifier 143 a current mirror type for amplifying a difference between an output signal of the fourth input signal integrating circuit 141 and an output signal of the fourth reference voltage integrating circuit 142, and a fourth latch circuit 144 for taking an output signal of the fourth differential amplifier 143 in respect to the fourth clock signal iclkb3. A fourth digital output signal D3 is outputted from the fourth latch circuit 144.

Figure 6:
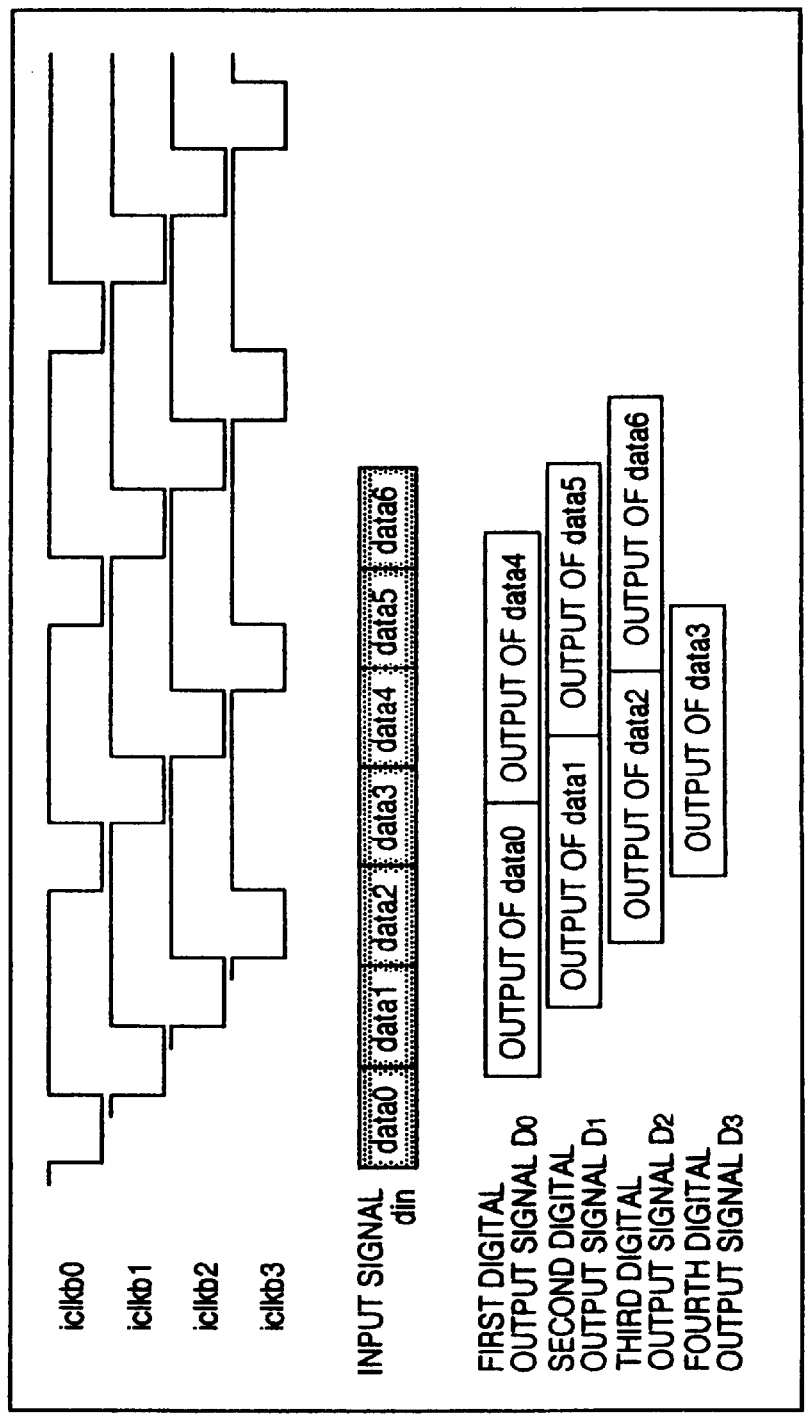
FIG. 6 is a diagram for explaining the operation of the signal input circuit shown in FIG. 5.

Next, the operation of the signal input circuit 100 according to the present embodiment will be described referring to FIG. 6. The first to fourth clock signals iclkb0 to iclkb3 are clocks having their phases shifted by ¼ from each other, as shown in FIG. 6. The first data data0 of the input signal din is subjected to a processing similar to that in the signal input circuit 20 shown in FIG. 3 or a processing in the first signal input circuit unit 110 at a timing based on the first clock signal iclkb0 so that it is converted into the first digital output signal D0. The second data data1 of the input signal din is subjected to a processing similar to that in the signal input circuit 20 shown in FIG. 3 or a processing in the second signal input circuit unit 120 at a timing based on the second clock signal iclkb1 so that it is converted into the second digital output signal D1. The third data data2 of the input signal din is subjected to a processing similar to that in the signal input circuit 20 shown in FIG. 3 or a processing in the third signal input circuit unit 130 at a timing based on the third clock signal iclkb2 so that it is converted into the third digital output signal D2. The fourth data data3 of the input signal din is subjected to a processing similar to that in the signal input circuit 20 shown in FIG. 3 or a processing in the fourth signal input circuit unit 140 at a timing based on the fourth clock signal iclkb3 so that it is converted into the fourth digital output signal D3. The fifth data data4 of the input signal din is subjected to a processing similar to that in the signal input circuit 20 shown in FIG. 3 or a processing in the first signal input circuit unit 110 at a timing based on the first clock signal iclkb0 so that it is converted into the first digital output signal D0. Subsequently, a similar operation is repeated. Thereby, the input signal din of 800 MHz/bit is processed in a pipe-line manner by the first to fourth signal input circuit units 110 to 140 so that the first to fourth digital output signals D0 to D3 of 200 MHz/bit are generated.

(Third Embodiment)

A signal input circuit according to a third embodiment of the present invention is constructed by first to fourth signal input circuit units in a manner similar to that in the signal input circuit 100 shown in FIG. 5 according to the second embodiment but is different in specific construction of the first to fourth signal input circuit units from the second embodiment.

Figure 7:
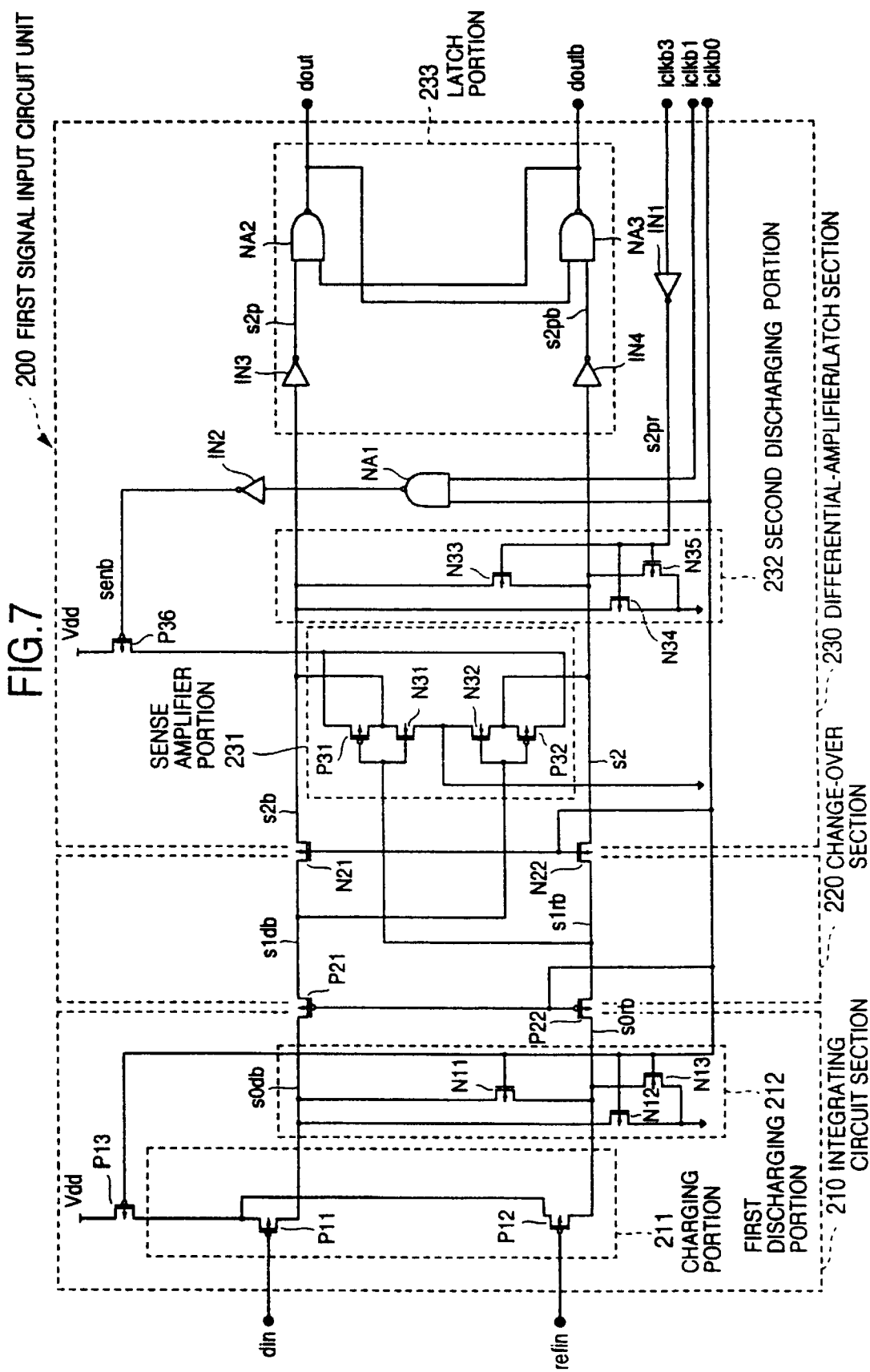
FIG. 7 is a block diagram showing a signal input circuit according to a third embodiment of the present invention.

The specific construction of the first signal input circuit unit 200 of the signal input circuit according to the present embodiment will now be described referring to FIG. 7.

The first signal input circuit unit 200 is composed of an integrating circuit section 210, a change-over section 220 and a differential-amplifier/latch section 230. The integrating circuit section 210 includes a charging portion 211 having first and second charging PMOS transistors P11 and P12, a first discharging portion 212 having first to third discharging NMOS transistors N11 to N13, and a first PMOS transistor P13. The gate of the first charging PMOS transistor P11 is inputted with an input signal din, and the gate of the second charging PMOS transistor P12 is inputted with a reference voltage refin. The drains of the first and second charging PMOS transistors P11 and P12 are connected to first and second integrating nodes s0db and s0rb, respectively. The sources of the first and second charging PMOS transistors P11 and P12 are connected to the drain of the first PMOS transistor P13. The source of the first PMOS transistor P13 is supplied with a power supply voltage Vdd. The gate of the first PMOS transistor P13 and the gates of the first to third discharging NMOS transistors N11 to N13 are inputted with the first clock signal iclkb0. The drain of the first discharging NMOS transistor N11 is connected to the first integrating node s0db and the source thereof is connected to the second integrating node s0rb. The drain of the second discharging NMOS transistor N12 is connected to the first integrating node s0db and the source thereof is grounded. The drain of the third discharging NMOS transistor N13 is connected to the second integrating node s0rb and the source thereof is grounded.

The connection of the integrating circuit section 210 and the change-over section 220 is controlled by first and second separating PMOS transistors P21 and P22. The connection of the change-over section 220 and the differential-amplifier/latch section 230 is controlled by first and second separating NMOS transistors N21 and N22. The gates of the first and second separating PMOS transistors P21 and P22 are inputted with the first clock signal iclkb0. The drain/source of the first separating PMOS transistor P21 is connected to the first integrating node s0db and the source/drain thereof is connected to a first node s1db. The drain/source of the second separating PMOS transistor P22 is connected to the second integrating node s0rb and the source/drain thereof is connected to a second node s1rb. The gates of the first and second separating NMOS transistors N21 and N22 are inputted with the first clock signal iclkb0. The drain/source of the first separating NMOS transistor N21 is connected to the first node s1db and the source/drain thereof is connected to a third node s2b. The drain/source of the second separating NMOS transistor N22 is connected to the second node s1rb and the source/drain thereof is connected to a fourth node s2.

The differential-amplifier/latch section 230 includes a sense amplifier portion 231 composed of a cross-coupled sense amplifier, a second discharging portion 232, a latch portion 233, first and second inverters IN1 and IN2, a first NAND gate NA1, and a second PMOS transistor P36. The sense amplifier section 231 has a first inverter circuit which includes a PMOS transistor P31 and an NMOS transistor N31 and a second inverter circuit which includes a PMOS transistor P32 and an NMOS transistor N32. An input of the first inverter circuit (or the gate of the PMOS transistor P31 and the gate of the NMOS transistor N31) is connected to the second node s1rb, and an input of the second inverter circuit (or the gate of the PMOS transistor P32 and the gate of the NMOS transistor N32) is connected to the first node s1db. An output of the first inverter circuit (or the connection point of the PMOS transistor P31 and the NMOS transistor N31) is connected to the third node s2b, and an output of the second inverter circuit (or the connection point of the PMOS transistor P32 and the NMOS transistor N32) is connected to the fourth node s2. The source of the PMOS transistor P31 of the first inverter circuit and the source of the PMOS transistor P32 of the second inverter circuit are supplied with the power supply voltage Vdd through the second PMOS transistor P36. The source of the NMOS transistor N31 of the first inverter circuit and the source of the NMOS transistor N32 of the second inverter circuit are grounded.

The second discharging portion 232 of the differential-amplifier/latch section 230 has fourth to sixth discharging NMOS transistors N33 to N35. The gates of the fourth to sixth discharging NMOS transistors N33 to N35 are inputted with the fourth clock signal iclkb3 through the first inverter IN1. The drain of the fourth discharging NMOS transistor N33 is connected to the third node s2b, and the source thereof is connected to the fourth node s2. The drain of the fifth discharging NMOS transistor N34 is connected to the third node s2b, and the source thereof is grounded. The drain of the sixth discharging NMOS transistor N35 is connected to the fourth node s2, and the source thereof is grounded.

The latch portion 233 of the differential-amplifier/latch section 230 has third and fourth inverters IN3 and IN4 and second and third NAND gates NA2 and NA3. An input terminal of the third inverter IN3 is connected to the third node s2b, and an input terminal of the fourth inverter IN4 is connected to the fourth node s2. An output signal of the third inverter IN3 is inputted to the second NAND gate NA2 through a fifth node s2p, and an output signal of the fourth inverter IN4 is inputted to the third NAND gate NA3 through a sixth node s2pb. An output signal dout of the second NAND gate NA2 is inputted to the third NAND gate NA3, and an output signal doutb of the third NAND gate NA3 is inputted to the second NAND gate NA2. Accordingly, the second and third NAND gates NA2 and NA3 form an RS flip-flop.

The first NAND gate NA1 of the differential-amplifier/latch section 230 are inputted with the first clock signal iclkb0 and the second clock signal iclkb1, and an output of the first NAND gate NA1 is inputted to the gate of the second PMOS transistor P36 through the second inverter IN2. The source of the second PMOS transistor P36 is supplied with the power supply voltage Vdd.

Next, the operation of the first signal input circuit unit 200 will be described referring to FIGS. 8A to 8D and FIGS. 9A to 9D.

When the first clock signal iclkb0 having a high level is inputted to the first signal input circuit unit 200, the first and second separating PMOS transistors P21 and P22 are both turned off so that the integrating circuit section 210 and the change-over section 220 are disconnected from each other. At this time, in the integrating circuit section 210, the first PMOS transistor P13 is turned off and hence the power supply voltage Vdd is not supplied to the sources of the first and second charging PMOS transistors P11 and P12. Also, since the first to third discharging NMOS transistors N11 to N13 are all turned on, the voltage of each of the first and second integrating nodes s0db and s0rb is brought into 0 V (a discharging operation in the integrating circuit section 210).

On the other hand, when the first clock signal iclkb0 having a low level is inputted to the first signal input circuit unit 200, the first to third discharging NMOS transistors N11 to N13 are all turned off and the first and second separating PMOS transistors P21 and P22 are turned on. As a result, the gates of the two MOS transistors P32 and N32 forming the second inverter circuit of the sense amplifier portion 231 are connected as integrating capacitances to the first integrating node s0db and the gates of the two MOS transistors P31 and N31 forming the first inverter circuit of the sense amplifier portion 231 are connected as integrating capacitances to the second integrating node s0rb. Also, the first PMOS transistor P13 having the gate inputted with the first clock signal iclkb0 of the low level is turned on so that the first and second charging PMOS transistors P11 and P12 are placed into take their operating conditions. Thereby, charges corresponding to the voltage of the input signal din are stored into the gates of the two MOS transistors P32 and N32 forming the second inverter circuit of the sense amplifier portion 231 and charges corresponding to the voltage of the reference voltage refin are stored into the gates of the two MOS transistors P31 and N31 forming the first inverter circuit of the sense amplifier portion 231. As a result, the voltage of each of the first and second integrating nodes s0db and s0rb increases toward the power supply voltage Vdd (an integrating operation or charging operation).

Figure 8A:
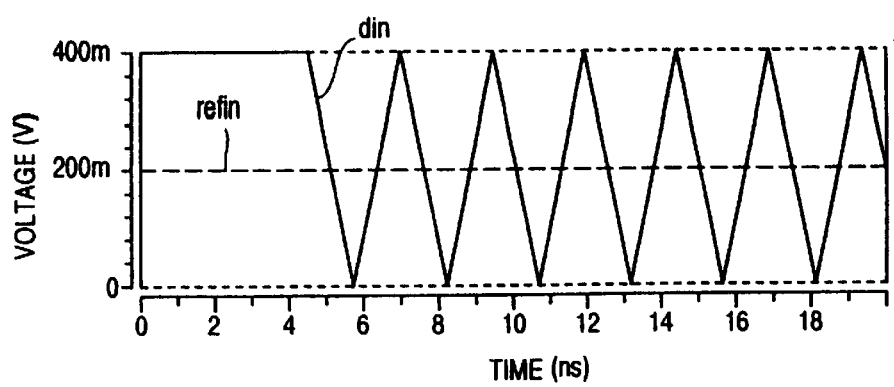
FIGS. 8A to 8D are waveform diagrams for explaining the operation of the signal input circuit shown in FIG. 7.
Figure 8B:
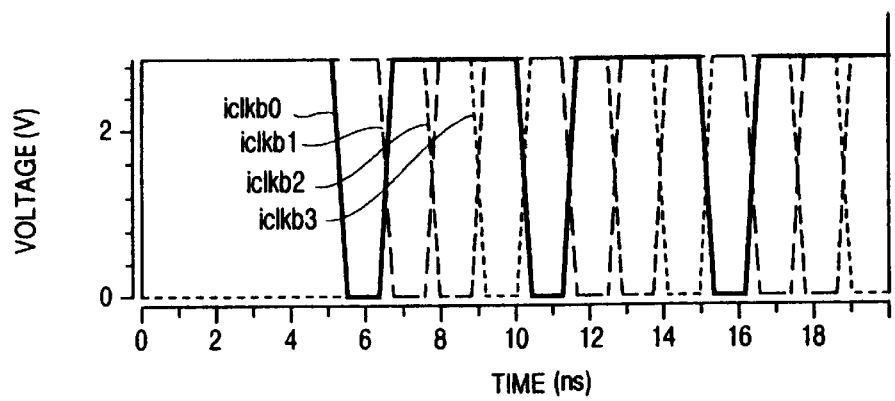
Figure 8C:
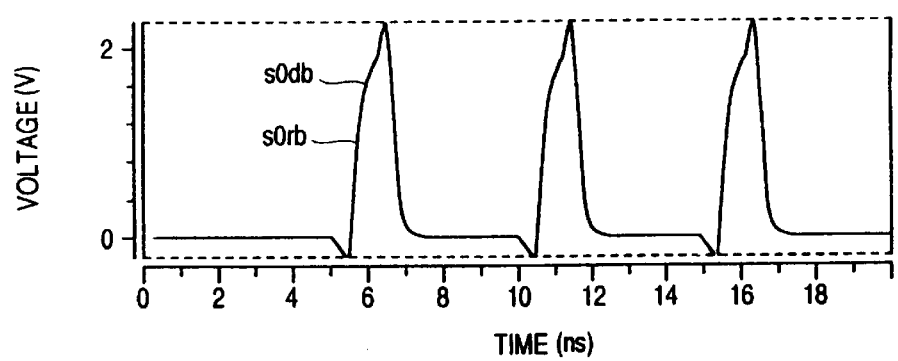
Figure 8D:
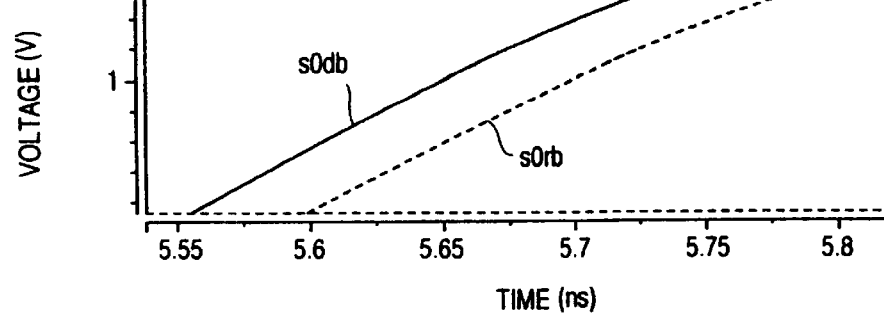

One simulation result of change of the voltages of the first and second integrating nodes s0db and s0rb will be described in reference to FIGS. 8A to 8D. As shown in FIG. 8A, the input signal din is a triangular wave which has an amplitude of ±200 mV for the reference voltage refin of 200 mV and a period of 2.5 ns. When the four-phase clock signal (or first to fourth clocks iclkb0 to iclkb3) as shown in FIG. 8B is inputted, the voltage of each of the first and second integrating nodes s0db and s0rb increases toward the power supply voltage Vdd (about 2.5 V), as shown in FIG. 8C. At this time, the voltage of the first integrating node s0db is larger than the voltage of the second integrating node s0rb, as shown in FIG. 8D which is an enlarged view of FIG. 8C in the vicinity of time instants of 5.5 ns to 6 ns.

The first and second inverter circuits forming the sense amplifier portion 231 of the differential-amplifier/latch section 230 are driven toward 0 V in the case where an input voltage is close to the power supply voltage Vdd and are driven toward the power supply voltage Vdd in the case where the input voltage is close to 0 V. Accordingly, in the case where the voltage of the first node s1db is closer to the power supply voltage Vdd than the voltage of the second node s1rb even if it is little, a driving force with which the second inverter circuit applied with the first node s1db as an input voltage drives the voltage of the fourth node s2 toward 0 V becomes larger than a driving force with which the first inverter circuit applied with the second node s1rb as an input voltage drives the voltage of the third node s2b toward 0 V. In the amplifying operation (that is, in a period of time when the first clock signal iclkb0 has a high level), the first and second separating NMOS transistors N21 and N22 are both placed in their turned-on conditions so that the first node s1db and the third node s2b are connected and the second node s1rb and the fourth node s2 are connected. As a result, the voltage of the second node s1rb becomes still smaller and the voltage of the first node s1db becomes still larger. With such a differential amplification operation, a small difference between the integrating voltages is amplified up to a level which is capable of being inputted to the first and second inverters IN1 and IN2 formed in a CMOS configuration.

When the fourth clock signal iclkb3 having a low level is inputted to the first inverter IN1, the discharging signal s2pr turns into a high level. As a result, the fourth to sixth discharging NMOS transistors N33 to N35 are all turned on so that each of the third and fourth nodes s2b and s2 are brought into 0 V (a discharging operation in the differential-amplifier/latch section 230).

In the latter half of a period of time until the first clock signal iclkb0 has a low level and in a period of time when the first clock signal iclkb0 has a high level, the differential-amplifier/latch section 230 continuously performs the discharging operation and the amplifying operation. Since the voltage of each of the third and fourth nodes s2b and s2 has been brought into 0 V as the result of the preceding discharging operation, each of the output signals of the third and fourth inverters IN3 and IN4 forming the latch portion 233 turns into a high level. Accordingly, the RS flip-flop formed by the second and third NAND circuits NA2 and NA3 holds a state immediately before the discharge.

Figure 9A:
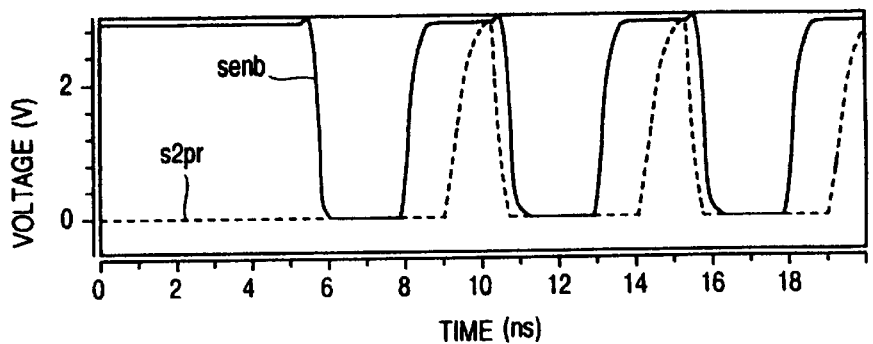
FIGS. 9A to 9D are waveform diagrams for explaining the operation of the signal input circuit shown in FIG. 7.
Figure 9B:
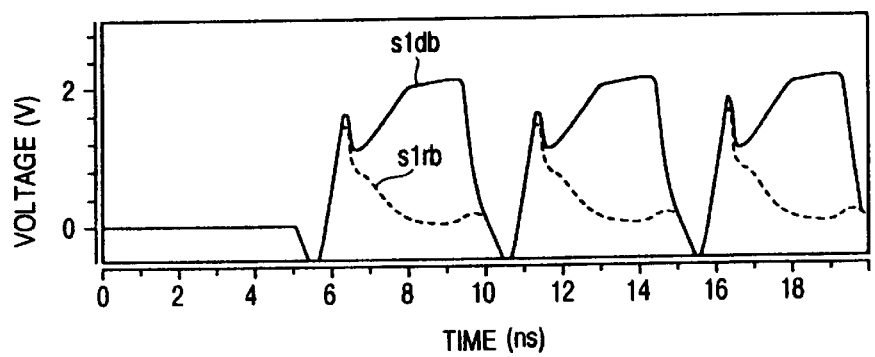
Figure 9C:
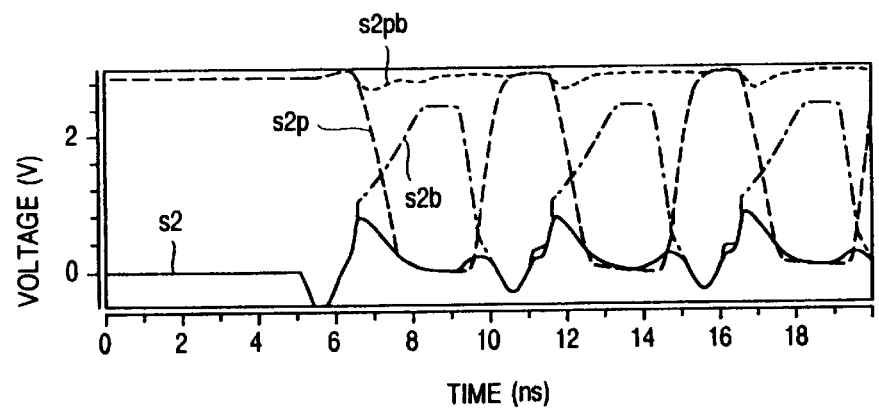

In the differential-amplifier/latch section 230, a logical product of the first clock signal iclkb0 and the second clock signal iclkb1 is determined by a logical product circuit formed by the first NAND circuit NA1 and the second inverter IN2 so that an amplifying operation enabling signal senb is generated. Due to a gate delay, however, the amplifying operation enabling signal senb becomes valid considerably later than an instant of time when the first clock signal iclkb0 turns into the low level. For example, for the first clock signal iclkb0 shown in FIG. 8B, the amplifying operation enabling signal senb assumes such a signal as shown by solid line in FIG. 9A. In a period of time when the amplifying operation enabling signal senb has a low level, the amplifying operation is performed. With this amplifying operation, the voltage of the first node s1db exhibits an increase as shown by solid line in FIG. 9B or increases amplified in the vicinity of time instants 6 ns to 8 ns subsequent to the increase of the voltage of the first integrating node s0db shown in FIGS. 8C and 8D. Thereby, a difference between the voltage of the first node s1db and the second node s1rb is enlarged, as shown in FIG. 9B and is amplified up to a level which is capable of being inputted to the first and second inverters IN1 and IN2 formed in the CMOS configuration (see FIG. 9C).

Figure 9D:
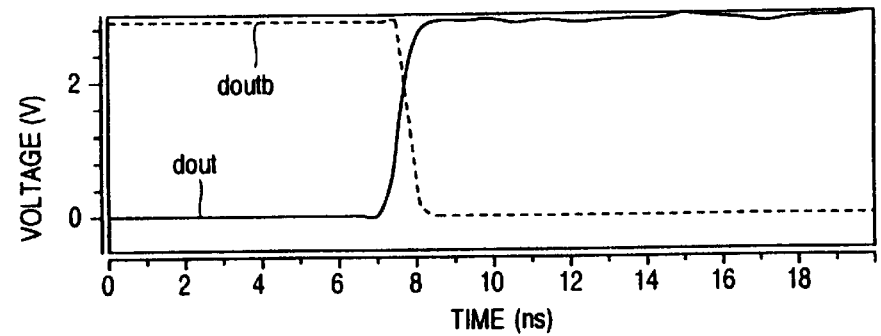

When an output signal of any one of the third and fourth inverters IN3 and IN4 turns into a low level, data is stored into the RS flip-flop formed by the second and third NAND circuits NA2 and NA3 and output signals dout and doutb are outputted from the second and third NAND circuits NA2 and NA3, respectively (see FIG. 9D). In FIG. 9D, it is shown that the output signal dout shown by solid line is held in a high level after the inversion thereof in the vicinity of a time instant of 8 ns. This is because the input signal din shown in FIG. 8A takes a high level at each sampling time.

Thereafter, when the fourth clock signal iclkb3 inputted to the first inverter IN1 turns into a low level, the discharging signal s2pr turns into a high level. As a result, the second discharging portion 232 of the differential-amplifier/latch section 230 is driven so that the third and fourth nodes s2b and s2 are brought into 0 V.

With the repetition of the above operation, it is possible to convert the small input signal din into the output signals dout and doutb in CMOS level.

What is claimed is:

1. A signal input circuit comprising:
   input signal analog integrating means for integrating an input signal having a noise component in only a predetermined integration period, said input signal integrating means includes an integrating circuit including a charge circuit and a discharge circuit which stores first charges corresponding to said input signal in only said predetermined integration period and thereafter releases the stored first charges before the next integration period;
   reference voltage analog integrating means for integrating a reference voltage comprising a substantially constant voltage including a noise component, in only said predetermined integration period, said reference voltage integrating means having an integrating circuit including a charge circuit and a discharge circuit which stores second charges corresponding to said reference voltage in only said predetermined integration period and thereafter releases the stored second charges before the next integration period; and
   differential amplifier means for amplifying a difference between an output signal of said input signal analog integrating means and an output signal of said reference voltage analog integrating means, whereby a logic signal is produced based upon the difference between the integrated input signal and the integrated constant voltage signal.

2. A signal input circuit according to claim 1, wherein said differential amplifier means includes a current mirror circuit.

3. A signal input circuit according to claim 1, wherein said differential amplifier means includes a cross-coupled sense amplifier.

4. A signal input circuit according to claim 1, further comprising a reset/set flip-flop circuit which holds an output signal of said differential amplifier means.

5. A signal input circuit comprising first and second signal input circuit units, wherein
   said first signal input circuit unit includes:
      first input signal analog integrating means for integrating an input signal in only a predetermined integration period at a timing defined by a first clock signal;
      first reference voltage analog integrating means for integrating a reference voltage comprising a constant voltage plus noise in only said predetermined integration period at said timing defined by the first clock signal; and
      first differential amplifier means for amplifying a difference between an output signal of said first input signal integrating means and an input signal of said first reference voltage integrating means, and
   said second signal input circuit unit includes:
      second input signal analog integrating means for integrating said input signal in only said predetermined integration period at a timing defined by a second clock signal other than said first clock signal;
      second reference voltage analog integrating means for integrating said reference voltage in only said predetermined integration period at said timing defined by the second clock signal; and
      second differential amplifier means for amplifying a difference between an output signal of said second input signal integrating means and an output signal of said second reference voltage integrating means.

6. A signal input circuit according to claim 5, wherein said first input signal integrating means includes an integrating circuit including a charge circuit and a discharge circuit which stores first charges corresponding to said input signal in only said predetermined integration period and thereafter releases the stored first charges before the next integration period, said first reference voltage integrating means includes an integrating circuit including a charge circuit and a discharge circuit which stores second charges corresponding to said reference voltage in only said predetermined integration period and thereafter releases the stored second charges before the next integration period, said second input signal integrating means includes an integrating circuit including a charge circuit and a discharge circuit which stores third charges corresponding to said input signal in only said predetermined integration period and thereafter releases the stored third charges before the next integration period, and said second reference voltage integrating means includes an integrating circuit including a charge circuit and a discharge circuit which stores fourth charges corresponding to said reference voltage in only said predetermined integration period and thereafter releases the stored fourth charges before the next integration period.

7. A signal input circuit according to claim 5, wherein each of said first and second differential amplifier means includes a current mirror type differential amplifier.

8. A signal input circuit according to claim 5, wherein each of said first and second differential amplifier means includes a cross-coupled sense amplifier.

9. A signal input circuit according to claim 5, further comprising:

a first reset/set flip-flop circuit which holds an output signal of said first differential amplifier means; and a second reset/set flip-flop circuit which holds an output signal of said second differential amplifier.

10. A signal input circuit comprising an integrating circuit section, a change-over section and a differential-amplifier/latch section, wherein said integrating circuit section includes:

a charging portion provided with a first charging transistor which has a gate inputted with an input signal and a drain connected to a first integrating node and a second charging transistor which has a gate inputted with a reference voltage and a drain connected to a second integrating node; and a first discharging portion for setting each of a voltage of said first integrating node and a voltage of said second integrating node to a predetermined voltage inclusive of 0 V in accordance with a first clock signal, said change-over section includes:

a first separating transistor having a source/drain connected to said first integrating node and a drain/source connected to a first node, said first separating transistor being turned on in accordance with said first clock signal;

a second separating transistor having a source/drain connected to said second integrating node and a drain/source connected to a second node, said second separating transistor being turned on simultaneously with said first separating transistor in accordance with said first clock signal;

a third separating transistor having a source/drain connected to said first node and a drain/source connected to a third node, said third separating transistor being turned on when said first separating transistor is turned off in accordance with said first clock signal; and a fourth separating transistor having a source/drain connected to said second node and a drain/source connected to a fourth node, said fourth separating transistor being turned on simultaneously with said third separating transistor in accordance with said first clock signal, and said differential-amplifier/latch section includes:

a sense amplifier portion provided with a first inverter circuit which has an input terminal connected to said second node and an output terminal connected to said third node and a second inverter circuit which has an input terminal connected to said first node and an output terminal connected to said fourth node, said sense amplifier portion amplifying a difference between a voltage of said first node and a voltage of said second node in accordance with a logical product of said first clock signal and a second clock signal different in phase from said first clock signal;

a second discharging portion for setting each of a voltage of said third node and a voltage of said fourth node to a predetermined voltage inclusive of 0 V in accordance with a third clock signal; and a latch portion provided with a reset/set flip-flop circuit inputted with the voltage of said third node and the voltage of said fourth node.

* * * * *